(12) United States Patent
Vavassori et al.

(10) Patent No.: US 11,981,607 B2
(45) Date of Patent: May 14, 2024

(54) METHOD AND ASSEMBLY FOR INFILTRATION AND RAPID PHASE DEPOSITION OF POROUS COMPONENTS

(71) Applicant: PETROCERAMICS S.P.A., Stezzano (IT)

(72) Inventors: Paolo Vavassori, Stezzano (IT); Massimiliano Valle, Stezzano (IT)

(73) Assignee: PETROCERAMICS S.p.A., Stezzano (IT)

( * ) Notice: Subject to any disclaimer, the term of this patent is extended or adjusted under 35 U.S.C. 154(b) by 250 days.

(21) Appl. No.: 17/290,503

(22) PCT Filed: Oct. 30, 2019

(86) PCT No.: PCT/IB2019/059291
§ 371 (c)(1),
(2) Date: Apr. 30, 2021

(87) PCT Pub. No.: WO2020/089803
PCT Pub. Date: May 7, 2020

(65) Prior Publication Data
US 2021/0380493 A1 Dec. 9, 2021

(30) Foreign Application Priority Data
Oct. 31, 2018 (EP) .................................. 18203800

(51) Int. Cl.
*C04B 35/83* (2006.01)
*C04B 41/00* (2006.01)
*C04B 41/45* (2006.01)

(52) U.S. Cl.
CPC ............ *C04B 35/83* (2013.01); *C04B 41/009* (2013.01); *C04B 41/457* (2013.01);
(Continued)

(58) Field of Classification Search
CPC ................................................... C04B 41/457
See application file for complete search history.

(56) References Cited

U.S. PATENT DOCUMENTS 3,925,577 A * 12/1975 Fatzer .................... C23C 16/325
427/253
4,824,711 A 4/1989 Cagliostro et al.
(Continued)

FOREIGN PATENT DOCUMENTS

| CA | 2268729 A1 | 4/1998 |
| CN | 103288466 A | 9/2013 |

(Continued)

OTHER PUBLICATIONS

International Search Report, issued in PCT/IB2019/059291, dated Feb. 17, 2020, Rijswijk, Netherlands.
(Continued)

*Primary Examiner* — Robert A Vetere
(74) *Attorney, Agent, or Firm* — Ferguson Case Orr Paterson

(57) ABSTRACT

A chemical vapor infiltration (CVI) method for densifying at least one porous component includes placing the at least one porous component inside a crucible, bringing temperature inside the crucible to a value adapted to densify the porous component to transform it into a densified component, bringing pressure inside the crucible between 0.1 KPa and 25 KPa, once operational temperature and pressure are reached, flowing gas inside the crucible, gas being suitable for densifying the porous component to transform it into a densified component, and keeping an oxidizing environment outside the crucible, the external environment lapping against the crucible. The crucible is provided of at least one material having thermal conductivity greater than 30 W/mK from room temperature to at least 1000° C. selected from: sintered silicon carbide (SiC), silicon-infiltrated silicon car-
(Continued)

bide (Si—SiC), sintered boron carbide (B4C), silicon-infiltrated boron carbide (Si—B4C), sintered zirconium carbide (ZrC), silicon-infiltrated zirconium carbide (Si—ZrC), a combination of silicon carbide (SiC), boron carbide (B4C) and sintered and/or silicon-infiltrated zirconium carbide (ZrC).

19 Claims, 6 Drawing Sheets

(52) U.S. Cl.
CPC .. *C04B 2235/46* (2013.01); *C04B 2235/5244* (2013.01); *C04B 2235/5248* (2013.01); *C04B 2235/614* (2013.01); *C04B 2235/658* (2013.01); *C04B 2235/77* (2013.01); *C04B 2235/9607* (2013.01)

(56) References Cited

U.S. PATENT DOCUMENTS

| | | | |
|---|---|---|---|
| 4,874,427 A * | 10/1989 | Hamada | C21B 13/14 75/483 |
| 5,024,878 A | 6/1991 | Robinbrosse et al. | |
| 5,238,710 A | 8/1993 | Ahmad et al. | |
| 5,254,374 A | 10/1993 | Devlin et al. | |
| 5,332,597 A | 7/1994 | Carolan et al. | |
| 5,389,400 A | 2/1995 | Ting et al. | |
| 5,480,678 A | 1/1996 | Rudolph et al. | |
| 5,580,678 A | 12/1996 | Rossoll | |
| 5,738,908 A * | 4/1998 | Rey | C04B 35/80 427/249.2 |
| 5,916,633 A * | 6/1999 | Lackey | C04B 35/83 427/249.4 |
| 6,068,930 A | 5/2000 | Lamouroux et al. | |
| 6,083,560 A * | 7/2000 | Fisher | C04B 35/83 427/249.2 |
| 6,187,379 B1 | 2/2001 | Lackey | |
| 6,197,374 B1 | 3/2001 | Hüttinger et al. | |
| 6,410,086 B1 | 6/2002 | Brandon et al. | |
| 8,105,649 B1 | 1/2012 | Wedding et al. | |
| 8,163,088 B2 | 4/2012 | Lamouroux et al. | |
| 8,491,963 B2 | 7/2013 | Lamouroux et al. | |
| 2004/0115348 A1 | 6/2004 | Landini et al. | |
| 2004/0157183 A1 * | 8/2004 | Bernhardt | H01L 21/67109 432/205 |
| 2005/0238564 A1 | 10/2005 | Walker et al. | |
| 2007/0054103 A1 | 3/2007 | Fareed et al. | |
| 2008/0143005 A1 | 6/2008 | Lim et al. | |
| 2010/0166955 A1 * | 7/2010 | Becker | C23C 16/4401 118/728 |
| 2010/0296621 A1 | 11/2010 | Broli et al. | |
| 2012/0231157 A1 | 9/2012 | Xie et al. | |
| 2013/0302616 A1 | 11/2013 | Kano | |
| 2014/0272373 A1 | 9/2014 | Chamberlain et al. | |
| 2014/0356534 A1 | 12/2014 | Hegermann et al. | |
| 2015/0152545 A1 | 6/2015 | Goujard et al. | |
| 2015/0152547 A1 | 6/2015 | Nakamura et al. | |
| 2016/0229758 A1 | 8/2016 | Kmetz et al. | |
| 2016/0305015 A1 | 10/2016 | Nakamura et al. | |

FOREIGN PATENT DOCUMENTS

| | | |
|---|---|---|
| CN | 103744302 A | 4/2014 |
| CN | 203561850 U | 4/2014 |
| CN | 104387113 A | 3/2015 |
| EP | 0499004 A1 | 8/1992 |
| EP | 2058841 A2 | 5/2009 |
| FR | 2401888 A1 | 3/1979 |
| KR | 101494237 B1 | 2/2015 |
| WO | 9616000 A1 | 5/1996 |
| WO | 9633295 A1 | 10/1996 |

OTHER PUBLICATIONS

International Written Opinion, issued in PCT/IB2019/059291, dated Feb. 17, 2020, Rijswijk, Netherlands.

* cited by examiner

METHOD AND ASSEMBLY FOR INFILTRATION AND RAPID PHASE DEPOSITION OF POROUS COMPONENTS

CROSS-REFERENCE TO RELATED APPLICATIONS

This application is a National Phase Application of PCT International Application No. PCT/IB2019/059291, having an International Filing Date of Oct. 30, 2019 which claims the benefit of priority to European Patent Application No. 18203800.0, filed Oct. 31, 2018, each of which is hereby incorporated by reference in its entirety.

FIELD OF THE INVENTION

The present invention relates to a method and assembly for rapid vapor phase infiltration and deposition (CVI—Chemical Vapor Infiltration) of porous components which are densified, for example when placed in stacks in a reactor.

In particular, the present invention relates to devices, or assemblies, for the infiltration and rapid vapor phase densification of preforms, for example ceramics. In these plants, within a reactor, or crucible, under suitable flow conditions, of partial pressure and temperature, the decomposition of a gaseous precursor, for example methane or methyltrichlorosilane, is obtained in its components, for example carbon and silicon carbide, which are deposited inside the porous preform composed of the same materials or compatible materials in the form of fibers, fabrics or other. Hereinafter, reference will be made to the densification of carbon preforms with carbon (C/C) but the same concepts may be extended to other types of materials.

For example, these porous components are substantially symmetrical circularly or annular with a central passage or opening, and which are placed in at least one stack or pile, which defines an internal passage formed by the central openings of the components.

Still further, the field of application of the invention lies in the manufacture of components which are made of a composite material comprising a porous substrate, or "preform", densified in its matrix, in particular in the production of brake discs of composite material by densification of preforms made of fibers, for example arranged in an annular shape.

BACKGROUND OF THE INVENTION

The manufacture of parts made of composite material, in particular parts consisting of composite material consisting of a fiber preform, for example carbon fibers or ceramic fibers, is obtained by densifying the preform matrix for example with infiltration methods for rapid vapor phase deposition.

Examples of such components are carbon—carbon (C—C) composite brake discs, in particular for sports car brakes or aircraft brakes. Densifying porous components by chemical vapor infiltration consists in placing the components in a reaction chamber, or crucible, of an infiltration plant and in injecting a gas into the chamber in which one or more components of the gas form a precursor for the material of the matrix of the component which must be deposited inside the component in order to thicken it.

The infiltration conditions, in particular the concentration, the gas flow rate, the temperature and the pressure inside the crucible chamber, are selected to allow the gas to diffuse inside the internal accessible pores of the components so that the material desired is deposited therein by deposition on the fibers or generically on the material of the component.

The conditions required for the chemical infiltration of the pyrolytic carbon vapor, or "pyrocarbon", have long been known to the person skilled in the art. The carbon precursor is an alkane, an alkyl or an alkene, generally propane, methane or a mixture of both. The infiltration is carried out at a temperature of about 1000° C. at a pressure from about 1 kPa (10 mmBar) to about 15 KPa (150 mmBar), therefore in fact in an environment defined as vacuum, although not hard.

One of the reasons, albeit not the main one, of the need for a vacuum, a vacuum environment, at least as defined above, lies in the simultaneous presence in this process of a flammable gas and high temperatures in the oven surrounding the reaction environment, conditions which could lead in case of accidental contact with oxygen to an explosion of the room and therefore of the crucible and of the whole plant.

The conditions required for the infiltration of chemical vapors of materials other than carbon, in particular ceramic materials, are also known. Reference may be made in particular to document FR-A-2 401 888 and document CA 02268729. In an industrial installation for the infiltration of chemical vapor, it is common practice to load the reaction chamber of the crucible with a plurality of substrates or preforms or components to be densified simultaneously, with the use of support tools or spacers placed between the components. When the preforms are annular, they can be placed in piles in a longitudinal direction to the reaction chamber.

The substrates are brought to the desired temperature by heating produced by a susceptor, or inductor, which is generally made of graphite placed in a graphite chamber which defines the internal volume of the oven chamber, forming an induction secondary which is electromagnetically coupled with an induction primary located outside the oven chamber. The gas containing the precursors of the material to be deposited inside the preforms is introduced into a longitudinal end of the chamber while the residual gas is evacuated from the opposite end where it is extracted by pump means or vacuum pumps. The gas is generally preheated before reaching the preforms that are to be densified, for example by passing through perforated preheating plates. The entire oven chamber is enclosed in a container, or vessel, so as to condition the environment surrounding the susceptor and the walls of the oven and above all the walls of the crucible contained therein. The imperative object is to reduce the pressure, thus reducing the presence of oxygen in the oven.

Graphite, or the like, is one of the most suitable materials for the preparation of the entire internal setup of the vessel both because it is able to withstand the high process temperatures, and because it is a material with electrical properties suitable for constituting resistors and susceptors, and for its high thermal conductivity. The consequence of using this material is the need to protect these components from oxidation. Thus oxygen is doubly dangerous, first of all due to the simultaneous presence of both a flammable gas such as methane and high temperatures, and also because in the environment with oxygen, for example, graphite components deteriorate due to oxidation. The need to have non-oxidizing environments and the removal of oxygen from the densifying gas, have induced all the solutions of the prior art, where there is a considerable volume of work, that is, suitable for an industrial process (therefore not for laboratory and tests of very small quantities) of a protective structure or chamber around the crucible, then a second chamber around the chamber formed by the crucible, which is sealed and adapted to be also emptied of oxygen, for example by the creation of vacuum also outside of the crucible, if not also the blowing of inert gases such as nitrogen. This requirement makes known plants very complex and extremely expensive.

More specifically, chemical infiltration of vapor is a time-consuming process. To meet the production requirements on an industrial scale, it is necessary to be able to densify as many substrates as possible, or preforms or components, simultaneously, while still ensuring that all the substrates are densified in the same way.

In particular, it is necessary that all the substrates reach the same degree of densification with a matrix with the same microstructure. For this purpose, document WO-A-96/33295 proposes to position annular preforms in one or more stacks which extend in the longitudinal direction of the reaction chamber, each stack defining a longitudinal internal passage. A similar solution is known from U.S. Pat. No. 5,580,678.

Other similar solutions are known from US2015152547, US2016305015, US2007054103, U.S. Pat. Nos. 5,024,878, 5,738,908, US2014272373, US2016229758, U.S. Pat. No. 6,068,930, WO9616000, EP2058841, US2014356534, CN103744302, EP0499004, U.S. Pat. Nos. 5,916,633, 6,197,374, US2012231157, CN203561850, U.S. Pat. Nos. 6,410,086, 5,332,597, 5,480,678, KR101494237, US2008143005, U.S. Pat. No. 6,187,379, US2004115348, US2016229758, US2016305015, US2015152547, US2005238564, U.S. Pat. No. 5,389,400, CN104387113, CN103288466, US2015152545, US2013302616, U.S. Pat. No. 4,824,711, US2010296621, U.S. Pat. Nos. 5,238,710 A, 8,163,088 B2, 6,083,560 A, 5,254,374 A, 8,105,649 B1, 6,197,374 B1, 5,738,908, 8,491,963 B2, 3,925,577 A.

These known solutions, however, as well as other known solutions for densifying carbon preforms, have some limitations. Among these, some derive from the technologies and materials used to make the devices or equipment.

In the process of rapid densification of carbon by decomposition of gas, in particular methane, the process temperature is around 1000-1150° C. There are few metal alloys with which to make the process chamber that can work at these temperatures. Furthermore, the atmosphere to which the chamber is exposed is strongly reducing for hydrogen produced by the methane decomposition reaction in the formation of pyrolytic carbon which is deposited on the component to be densified. In fact the reactor is closed in a second sealed container which works in vacuum or inert gas. Furthermore, these high temperature materials (e.g. Kanthal®) have a strong reduction in mechanical features and are subject to degradation (e.g. creep). This involves sizing the walls of the reactor with very significant thickness (typically some tens of millimeters) with consequent increase in costs in addition to the limited useful life of the component. Furthermore, there are also safety issues because an accidental overheating of a few tens of degrees with respect to the operating limit can cause the collapse of the structure.

For this set of reasons the reactors, in particular Rapid-CVI reactors that use methane, are made with a graphite reaction chamber that can work without problems at the required temperatures and in a reducing atmosphere.

Obviously this chamber must be closed inside a second gas-tight vessel, usually in stainless steel, suitably insulated with carbon refractories and water-cooled, with consequent costs and complexity of the plant. Resistors or inductors for reactor heating are also made of graphite (see FIG. 1).

Furthermore, the graphite reaction chamber is not able to ensure the tightness of the reaction gases, whose leakage into the external vessel causes the reaction carbon to deposit in thick and compact layers on the outer part of the chamber itself. In addition to this, the carbon is generally deposited on all the internal walls of the reactor, on the thermal insulators which gradually degrade, on the graphite bars of the resistor which must be cleaned, and inside the slots present in the supports which tend to become blocked.

Although the temperatures involved, the amount of heat needed for the entire process and the precision in the control and uniformity of heating could be managed with a conventional gas heating system, with significant savings on the cost of energy, a similar solution cannot be implemented precisely because all the materials used are graphite-based and therefore cannot be exposed to flame in air.

A further aspect which is not solved by the known solutions relates to the pumping unit which allows keeping the reactor chamber in depression, which in current systems is achieved with a liquid ring pump. The choice of this type of pump is dictated by different needs. First of all, this choice ensures operation in the presence of a gas contaminated with aromatic compounds which, by condensing, form tar that is deposited inside the pipes and the pump. Furthermore, the aim is to avoid contact of the methane and hydrogen mixture with flammable substances. Furthermore, it is necessary to meet the vacuum level and flow rate specifications. On the other hand, this solution also has a number of important drawbacks. The entire pumping unit is very expensive; alone it can represent almost 40% of the cost of the entire plant. Furthermore, it requires frequent cleaning (about every 400 hours) and long plant stops. It still requires further disposal of large volumes of contaminated water.

Therefore, the requirements of having a high production efficiency with the contrasting and concurrent need to constructively simplify the production assemblies, while maintaining a high production quality, remain strongly felt.

These needs have led the applicant to search for new plant solutions.

SUMMARY OF THE INVENTION

These and other needs and objects are achieved by a chemical vapor infiltration method and an assembly for densifying porous components as described and claimed herein.

Some advantageous embodiments are the subject of the dependent claims.

The present invention has allowed having an oxidizing environment external to the crucible which leads to much less complex and expensive systems, which allow the use of a type of oven much simpler to build, to manage, and less expensive to maintain; for example oxide ovens.

Furthermore, according to a further embodiment, by virtue of the proposed solution, a considerable simplification is achieved in the plant, for example by reducing the vacuum system, eliminating the gaskets necessary to maintain the necessary seals, changing the materials of the components and of the crucible itself with more advantageous materials.

For example, if a carbide crucible, for example of silicon, is used, it is possible to replace the graphite of the oven chamber and of the resistors with other materials which can operate at high temperature even in the presence of air (oxidizing environment), allowing eliminating two constructive constraints: keeping the vacuum outside the crucible and the heating method using graphite resistors.

For example, in a proposed solution a crucible made of ceramic material is used, namely silicon-infiltrated silicon carbide. This material has a number of positive features:

withstands temperatures up to 1400° C. without degradation of the mechanical features;

at these temperatures it can be exposed to both oxidizing and reducing atmosphere without being chemically attacked;

does not react with carbon and therefore pyrolytic carbon does not settle or deposit without adhesion on its surface and can be removed easily, simplifying maintenance operations.

this crucible has a high thermal conductivity (between 100 and 200 W/m K at 20° C. and higher than 30 W/m K up to at least 1000° C.). For comparison, that of steels is of the order 10-30 W/m K at 20° C. which decreases with increasing temperature; among other things, steels have a problem of deterioration of the mechanical properties as temperatures rise. Therefore, this material efficiently transmits heat through the crucible walls, reducing the energy transients needed to reach the desired temperature and the gradients inside the reaction chamber.

Furthermore, this material has a low density (3 kg/dm3) and therefore does not require important, bulky and expensive support structures.

Still further, it is possible to produce reactors with a volume of at least 0.5 m3, to accommodate medium to large sized products to be densified.

Moreover, by virtue of the proposed solutions it is no longer necessary to necessarily keep the vacuum outside the crucible and therefore it is no longer necessary to make the external container for the crucible of the oven in steel or similar materials and to provide a vacuum seal. Otherwise, a simple insulated carpentry structure can be used, allowing dramatically reducing the constructive complexity and costs.

For example, refractory materials, currently made with expensive graphite foam, can be replaced with more conventional and inexpensive oxide-based refractories.

Heating, for example electrical, can be done by replacing the graphite resistors with conventional Kantal® resistors, which are simpler and easier to drive electrically, with further simplification of the plant by virtue of the elimination of the transformer.

Furthermore, according to further embodiments, it is possible to eliminate the electric heating with the resistors and replace it with a gas burner system. This solution appears particularly advantageous, because it allows reusing a part of the reactor exhaust gases. In fact the carbon deposition yields are low and therefore when the oven is discharged there is a gas mixture which still contains about 65% of methane and 30% of hydrogen, which in the solutions prior to the present invention is introduced directly into the atmosphere or burned in afterburners exiting the plant. In both cases there is an impact on the environment and a waste of potentially reusable gas. With the use of the exhaust gas from the crucible to heat the oven, a double economic and environmental advantage is obtained.

In the case of using a crucible in carbides, for example of silicon, since the reactor can be exposed to the air without being damaged, considering that the silicon carbide withstands high thermal shocks, once the high temperature densification step is over the oven can be opened to extract the crucible without waiting for the long cooling step. In fact the materials of the resistances and refractories do not degrade following exposure to high temperature air. Therefore, it is possible to make a plant in which the closed and vacuum reactor is removed still hot and replaced with another reactor loaded with a new batch of preforms to be densified. In this way the cooling times and the heating times are considerably reduced (the oven is, and remains hot), with a consequent increase in the productivity saving of the energy necessary for the heating transient.

If a carbide crucible, for example of silicon, or ceramic reactor is used, an advantageous technological aspect is that of allowing the use of a different technology for the vacuum seals between the parts of the reactor (chamber and lid) and between them and external pipes. The parts that make up the reactor must work at temperatures above 1000° C. There are substantially no materials which can be used as a gasket to seal at these temperatures. However, the vacuum levels that must be ensured inside the crucible are not hard; therefore it is sufficient that the losses are less than 0.2 mbar/min at 150 mbar of partial pressure. According to an embodiment, the solution adopted is not to insert any gasket but to directly contact the ceramic surfaces of the crucible that have been previously ground and possibly lapped until a roughness value is obtained that is low enough to ensure the mutual sealed contact. The pressure exerted between the various parts of the crucible due to their own weight and to the application of the vacuum inside the crucible chamber is sufficient to ensure the seal throughout the range of operating conditions of the reactor. The external connections of the chamber (reaction gas inlet and outlet) were found to be at temperatures below 150° C. in all operating conditions and therefore for these joints it is possible to use conventional high temperature gaskets (for example in graphite).

According to an embodiment, for the suction line of the reaction gases containing heavy hydrocarbons a condensation system is inserted along the connecting line between the reactor and the pump which cools the gases and condenses the tar. It is not necessary to achieve an almost complete elimination such as to be within the limits of environmental emissions; it is sufficient to have a tar reduction sufficient to allow the use of a conventional dry pump for the formation of the vacuum.

The connecting pipes used are jacketed and water-cooled. Their length is dimensioned so as to obtain gas cooling before entering the pump up to 60° C. The different sections of the line are inclined and the tar that condenses is collected in a series of wells that can be opened for cleaning. This solution makes maintenance and cleaning operations rapid and infrequent, since the condensed tar is all collected without any dilution liquid to dispose of. In addition to the advantages related to maintenance, the reduction of plant costs must be considered, which does not only concern the elimination of the water tank and the connected components but also the elimination of the heat exchanger and the refrigeration unit which are currently required for the liquid ring pump which requires water from 15° to 18° C. constant to work properly. By virtue of the proposed solution, water from a cooling tower can be used from 25 to 30° C.

BRIEF DESCRIPTION OF THE DRAWINGS

Further features and the advantages of the invention will be made readily apparent from the following description of preferred embodiment examples thereof, provided purely by way of a non-limiting example, with reference to the accompanying figures, in which.

DESCRIPTION OF SOME PREFERRED EMBODIMENT EXAMPLES

Figure 1:
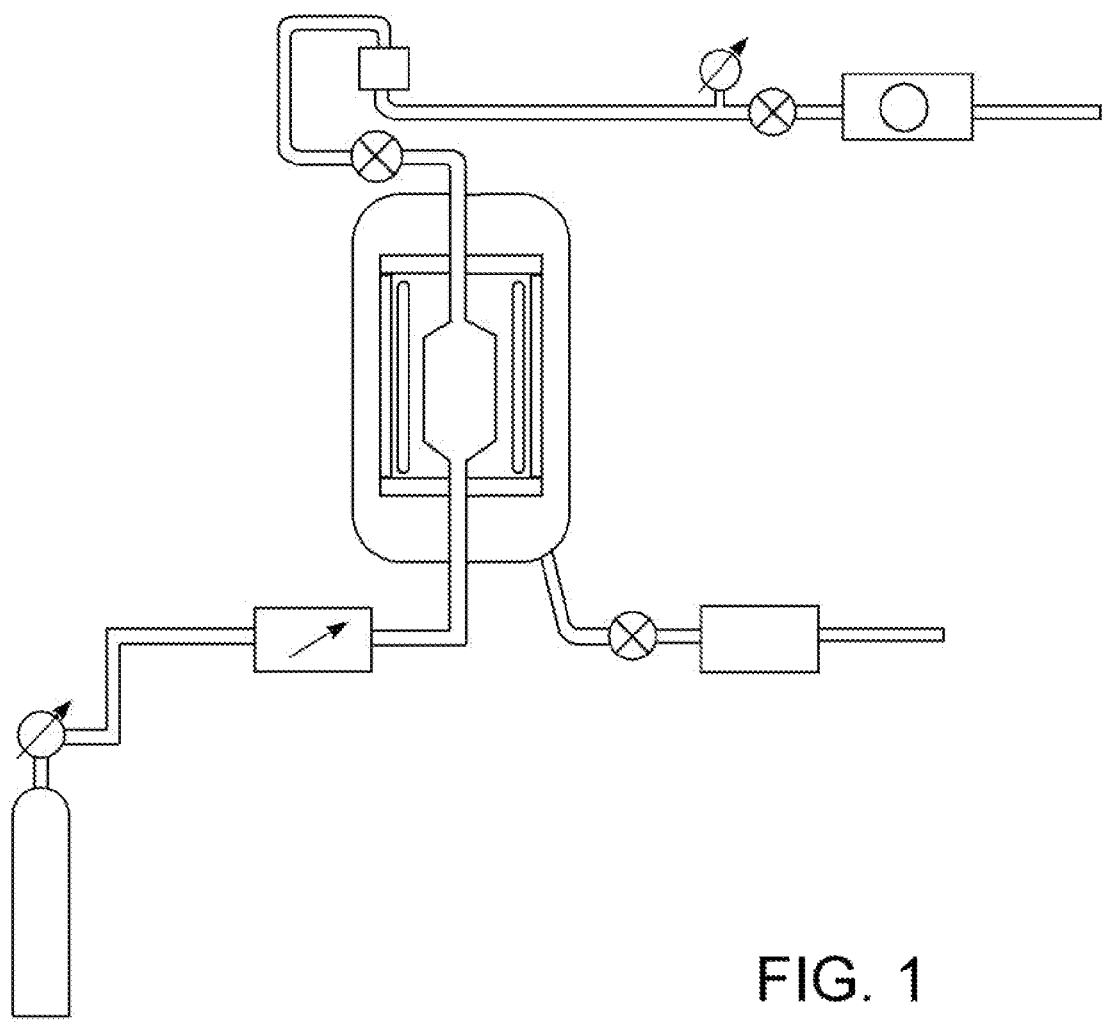
FIG. 1 shows a diagram of a CVI plant according to the prior art.
Figure 2:
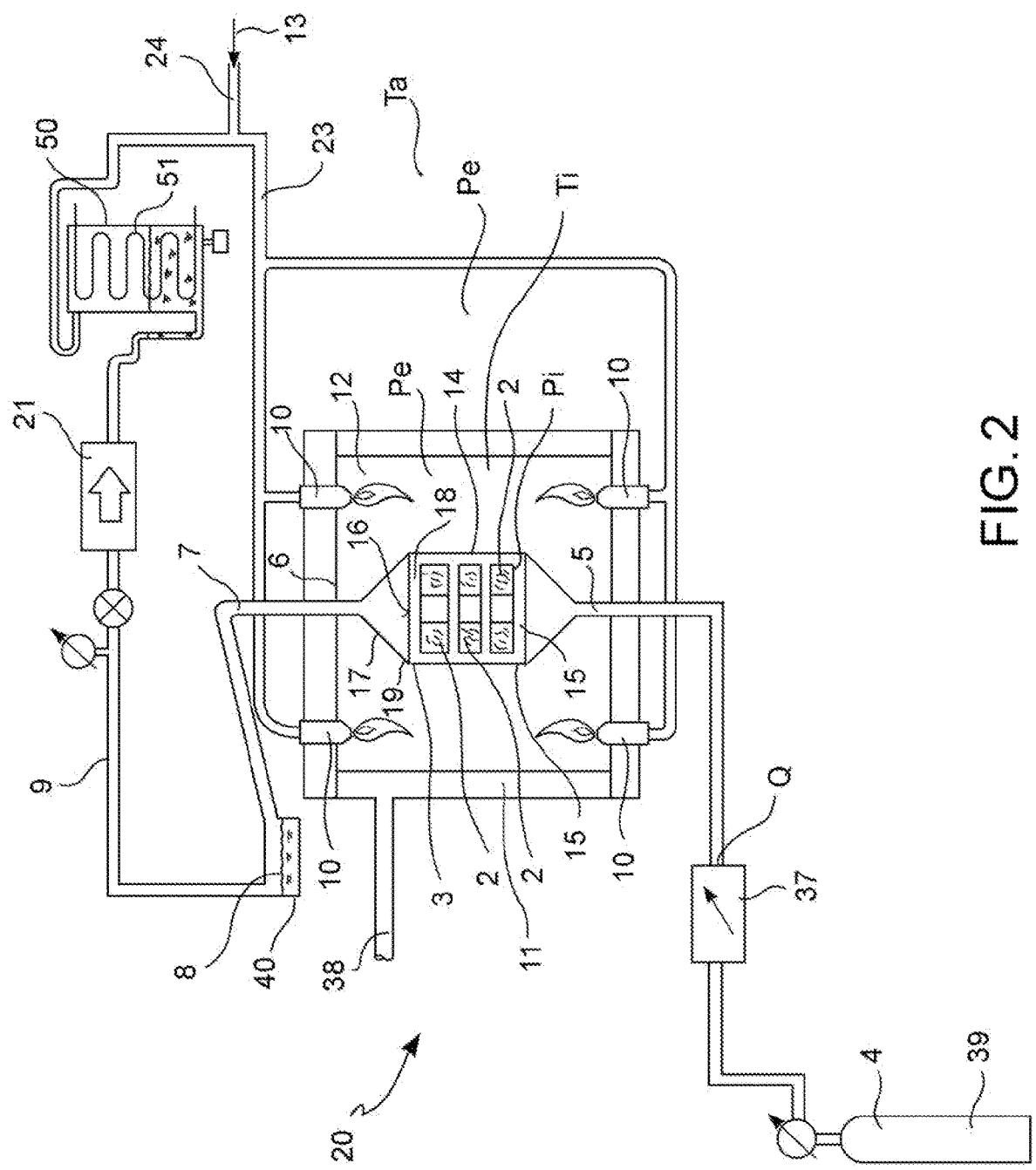
FIG. 2 shows a diagram of a rapid vapor phase infiltration and deposition plant according to a first embodiment, in which the oven uses burner devices.
Figure 3:
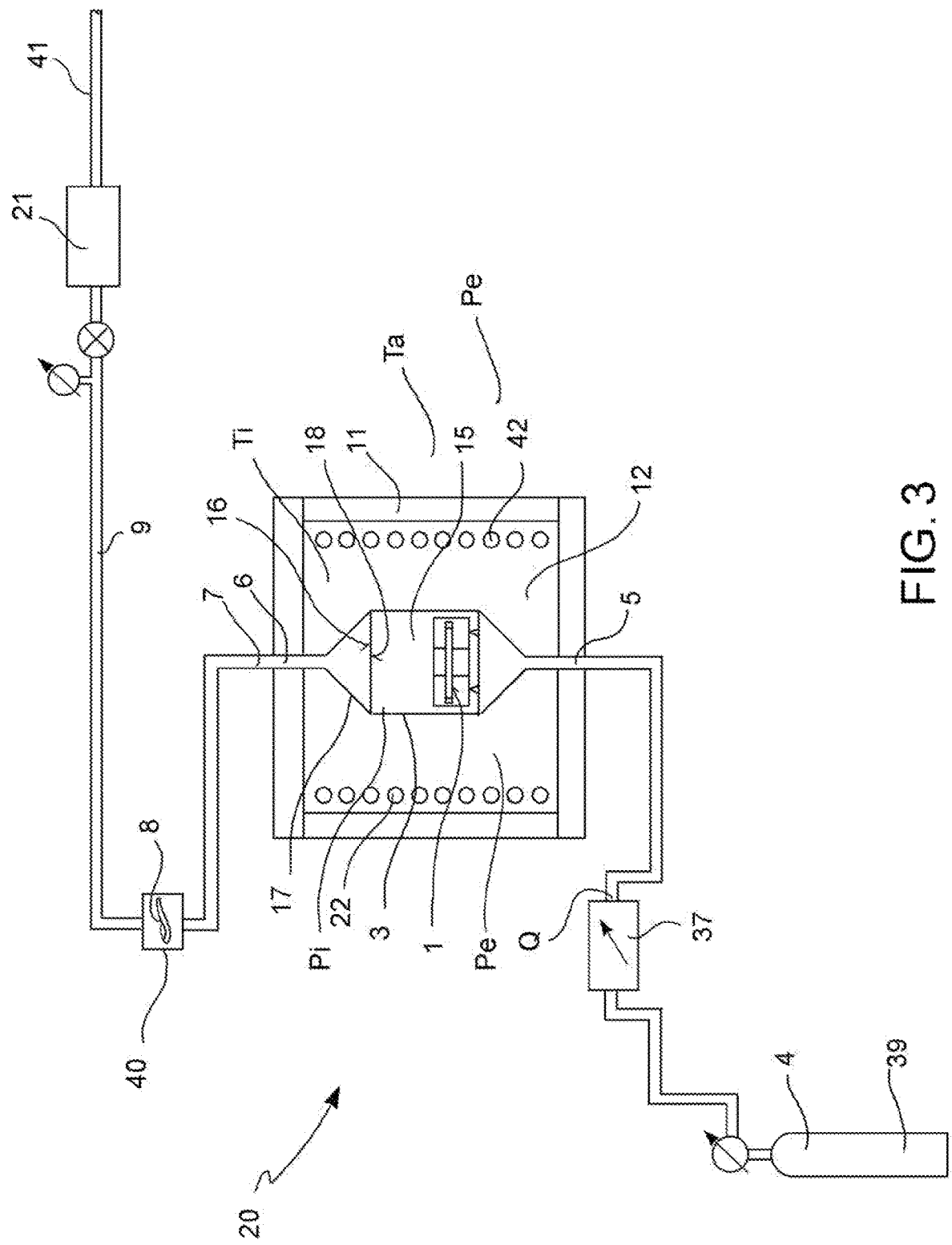
FIG. 3 shows a second diagram of a rapid vapor phase infiltration and deposition plant according to a second embodiment, in which the oven uses electrical resistance or induction devices.
Figure 4:
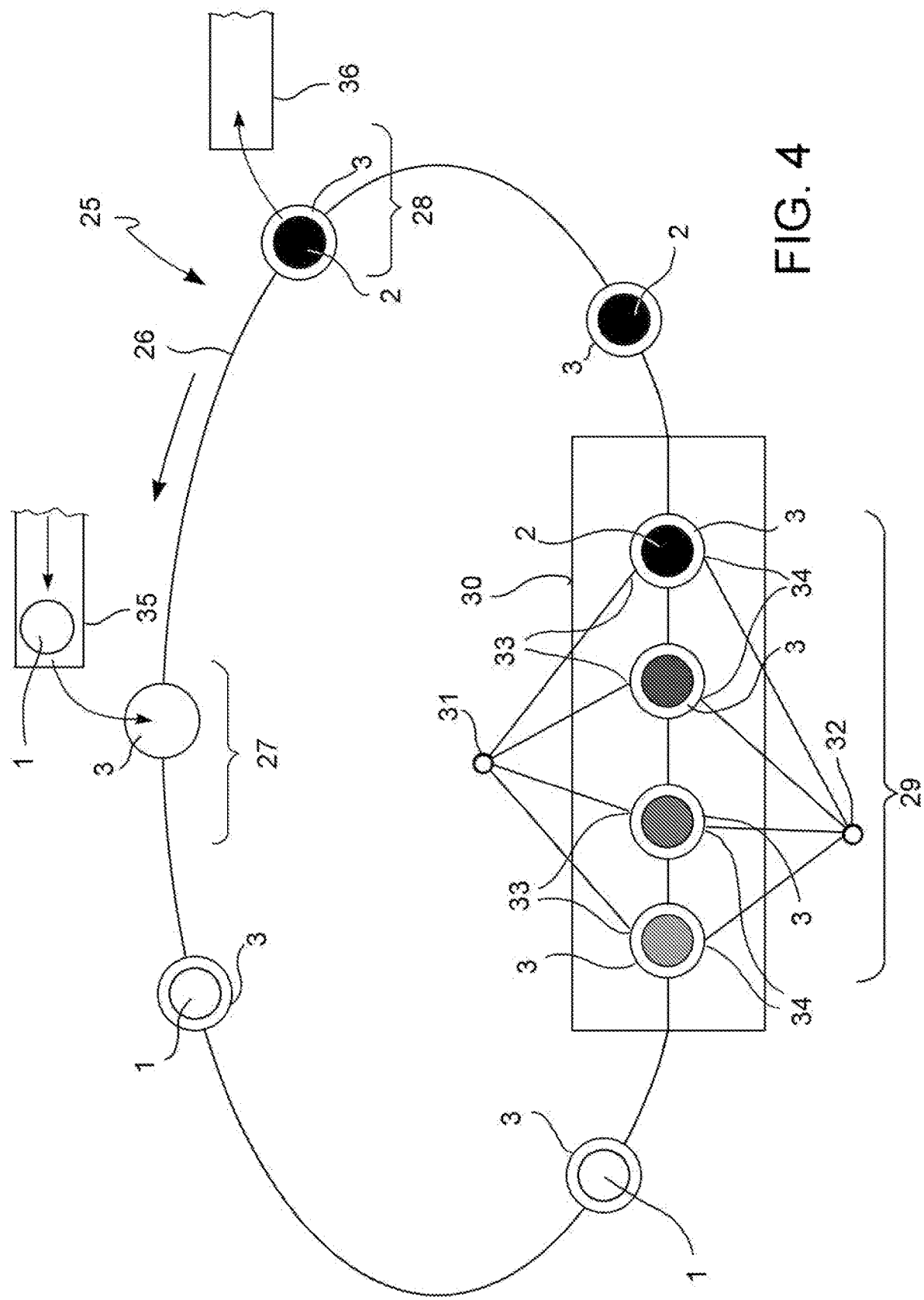
FIG. 4 shows a third diagram of a rapid vapor phase infiltration and deposition plant according to a third embodiment, in which the oven is of the tunnel type and a circuit or carousel is provided for moving a plurality of crucibles passing through in different stations for loading, processing in the oven and unloading the components.
Figure 5:
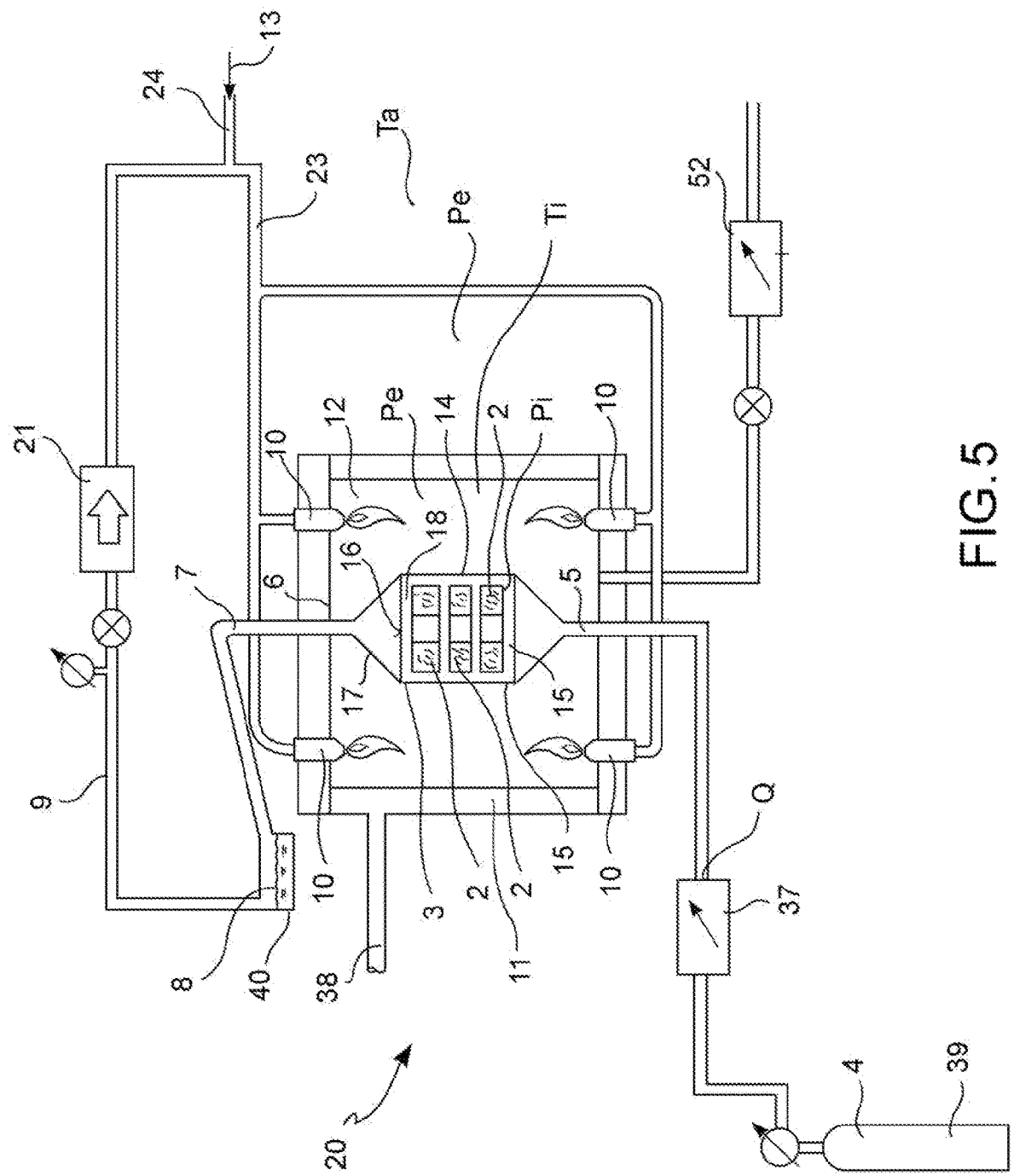
FIG. 5 shows a fourth diagram of a rapid vapor phase infiltration and deposition plant according to a fourth embodiment, in which a container external to the sealed crucible is provided to bring the pressure into an external chamber and adjacent to the crucible below the room pressure.
Figure 6:
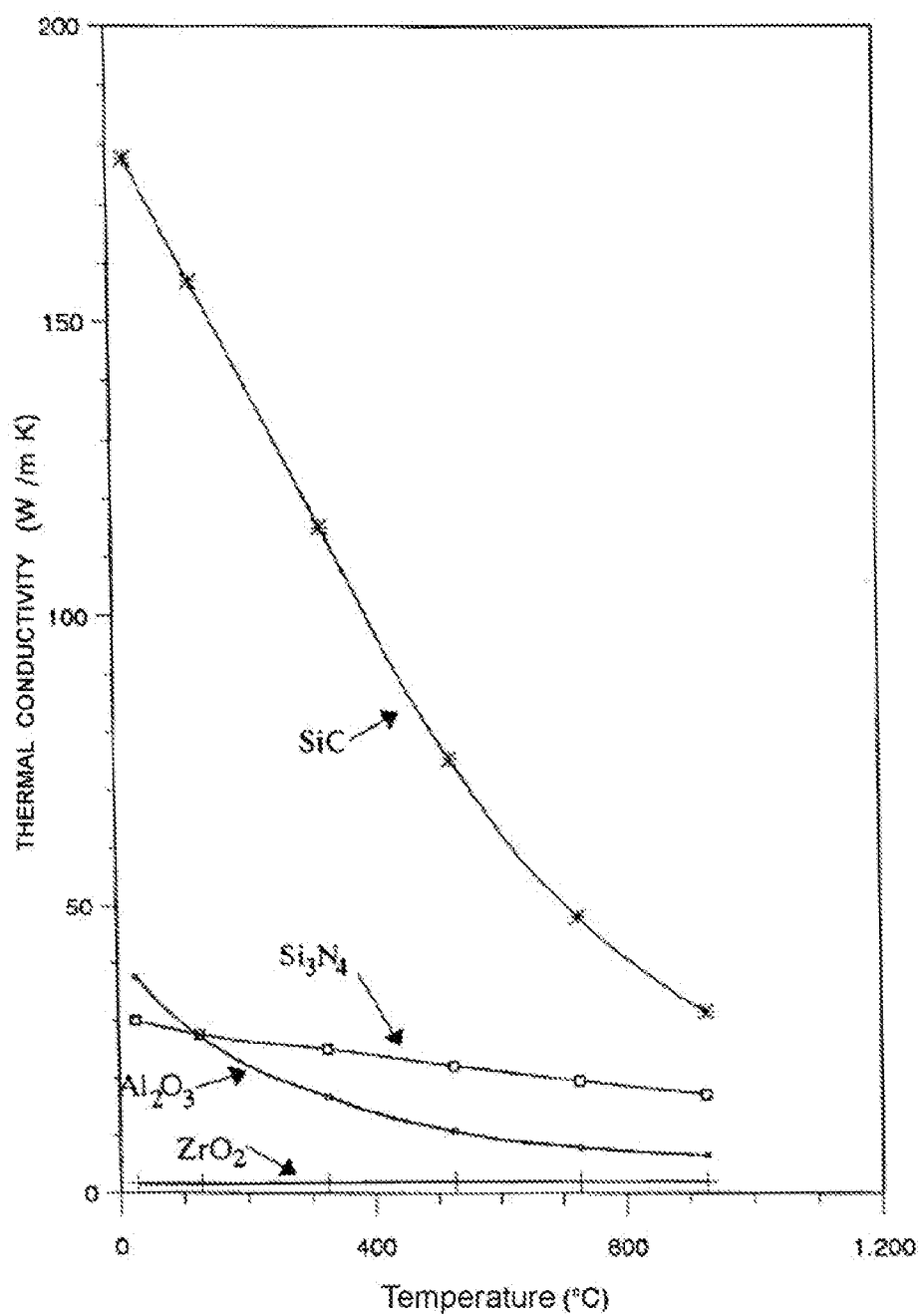
FIG. 6 graphically shows the pattern of the thermal conductivity at the temperature change for different materials compared with SiC.

The term "reducing atmosphere" or "reducing" means, for example, a reducing atmosphere for hydrogen produced by the methane decomposition reaction in the formation of pyrolytic carbon which is deposited on the component to be densified.

According to a general embodiment, a CVI or chemical vapor infiltration method for densifying at least one porous component 1, comprising at least the steps of:
placing the at least one porous component 1 inside a crucible 3;
bringing the temperature and the pressure Ti, Pi inside the crucible 3 to a value adapted to densify the porous component 1 to transform it into a densified component 2;
once the operational temperature and pressure are reached, flowing a reaction gas 4 inside the crucible;
said reaction gas, or gas 4, is fed into the crucible 3, said gas 4 being suitable for densifying the porous component 1 to transform it into a densified component 2;
wherein the following further steps are provided
keeping an oxidizing environment outside the crucible 3, wherein said external environment laps against said crucible 3;
and wherein
said crucible 3 is provided of a material which allows a thermal conductivity greater than 30 W/mK from room temperature to 1000° C.

This material can be selected from at least one of the following materials:
sintered silicon carbide (SiC);
or
silicon-infiltrated silicon carbide (Si—SiC);
or
sintered boron carbide (B4C);
or
silicon-infiltrated boron carbide (Si—B4C);
or
sintered zirconium carbide (ZrC);
or
silicon-infiltrated zirconium carbide (Si—ZrC);
or a combination of silicon carbide (SiC), boron carbide (B4C) and sintered and/or silicon-infiltrated zirconium carbide (ZrC).

By virtue of this solution, the crucible chamber is effectively and quickly heated.

According to a further embodiment of the method, there is provided the further step of bringing the pressure Pi inside the crucible 2 between 0.1 KPa and 25 KPa.

According to a further general embodiment independent of the preceding one, a CVI or chemical vapor infiltration method for densifying at least one porous component 1, comprising at least the steps of:
providing a graphite crucible 3;
placing the at least one porous component 1 inside said crucible 3;
bringing the temperature and the pressure Ti, Pi inside the crucible 3 to a value adapted to densify the porous component 1 to transform it into a densified component 2;
feeding gas 4 into the crucible 3, said gas 4 being suitable for densifying the porous component 1 to transform it into a densified component 2;
wherein the following further steps are provided
at operational temperature and pressure, flowing a reaction gas 4 inside the crucible 3;
and wherein
the pressure Pe outside the crucible 3 is kept equal to room pressure.

According to a further embodiment of the method, there is provided the further step of coating and/or covering said graphite crucible with an oxidation-resistant material.

According to a further embodiment of the method, there is provided the further step of bringing the pressure Pi inside the crucible 2 between 0.1 KPa and 25 KPa.

According to a further embodiment of the method, there is provided the further step of coating said crucible 3 with an oxidation-resistant coating.

According to a further embodiment of the method, there is provided the further step in which said coating is made of a material comprising Engobbio®, or engobe (see for example www.stradaceramica.it/glossario2/ or en.wikipedia.org/wiki/Slipware).

According to a further embodiment of the method, there is provided the further step in which said coating is made of a material comprising metals, for example refractory steels.

According to a further embodiment of the method, there is provided the further step of obtaining a reducing environment inside the crucible (3), at operational temperature, pressure and fluxing of the gas.

According to a further embodiment of the method, there is provided the further step of providing as a porous component 1 a component with a matrix comprising fibers.

According to a further embodiment of the method, there is provided the further step of providing as a porous component 1 a component with a matrix comprising carbon fibers.

According to a further embodiment of the method, there is provided the further step of providing as a porous component 1 a component with a matrix comprising carbon fibers and pyrolytic carbon.

According to a further embodiment of the method, there is provided the further step of providing as a porous component (1) a component with a matrix comprising silicon carbide (SiC) fibers.

According to a further embodiment of the method, there is provided the further step of providing as a porous component (1) a component with a matrix comprising silicon carbide (SiC) and pyrolytic carbon fibers.

According to a further embodiment of the method, there is provided the further step of providing as a porous component (1) a component with a matrix comprising silicon carbide (SiC) and silicon carbide fibers.

According to a further embodiment of the method, there is provided the further step of bringing the temperature Ti inside the crucible 3 between 900° C. and 1300° C., preferably from 1050 to 1200° C.

According to a further embodiment of the method, there is provided the further step of: once an operational temperature suitable for densification is reached, obtaining a non-oxidizing environment inside the crucible (3); and wherein, throughout the process, an oxidizing environment is kept outside the crucible (3), in which said external environment laps against said crucible (3).

According to a further embodiment of the method, there is provided the further step, once an operational temperature suitable for densification is reached, of obtaining a reducing environment inside the crucible 3; and wherein, throughout the process, an oxidizing environment is kept outside the crucible 3, in which said external environment laps against said crucible 3.

According to a further embodiment of the method, there is provided the further step of providing said crucible 3 of a material which allows a thermal conductivity between 120 and 80 W/mK at 400° C.

According to a further embodiment of the method, there is provided the further step of keeping the pressure Pe outside the crucible 3 equal to room pressure about 90 KPa.

According to a further embodiment of the method, there is provided the further step, once an operational temperature and pressure suitable for densification are reached, of obtaining a reducing environment inside the crucible 3; and keeping an oxidizing environment outside the crucible 3, in which said external environment laps against said crucible 3.

According to a further embodiment of the method, there is provided the further step of adjusting the flow of gas (4) at the inlet (5) to the crucible (3) to a value of between 0.1 l/min/dm3 and 10 l/min/dm3.

According to a further embodiment of the method, there is provided the further step of adjusting the flow of gas 4 at the inlet 5 of the crucible 3 to a value of between 1 l/min/dm3 and 5 l/min/dm3.

The flow of gas 4 may be slower to have a greater deposition of pyrolytic carbon which can be restructured in graphite with post-treatment, allowing a higher conductivity of the material.

Going towards a greater gas flow speed, a carbon deposit is obtained which is more difficult to restructure, but production times are reduced.

According to a further embodiment of the method, there is provided the further step, during the start-up of the process, as long as the temperature of the crucible has not reached a value close to the value adapted to densify the porous component 1 to transform it into a densified component 2, of washing the crucible with nitrogen N2.

According to a further embodiment of the method, there is provided the further step of bringing the pressure (Pi) inside the crucible (2) between 1 KPa and 20 KPa.

According to a further embodiment of the method, there is provided the further step of bringing the pressure Pi inside the crucible 3 between 10 KPa and 15 KPa.

According to a further embodiment of the method, there is provided the further step in which said crucible 3 avoids a thermal barrier between the environment outside the crucible itself and the environment inside the crucible itself from being defined.

According to a further embodiment of the method, there is provided the further step of providing said crucible 3 so that its thermal conductivity is higher than 30 W/mK at 1000° C.

According to a further embodiment of the method, there is provided the further step of keeping the pressure Pe outside the crucible 3 equal to room pressure.

According to a further embodiment of the method, there is provided the further step of adjusting the flow of gas 4 at the inlet 5 of the crucible 3 between 10 l/min and 60 l/min.

According to a further embodiment of the method, there is provided the further step of bringing the pressure Pe outside the crucible 3 not less than 15 KPa.

According to a further embodiment of the method, there is provided the further step of keeping a pressure difference between the environment inside the crucible 3 and outside the crucible 3, in which the external environment has an over-pressure with respect to the internal environment of above 5 Kpa.

According to a further embodiment of the method, there is provided the further step of keeping a pressure difference between the environment inside the crucible 3 and outside the crucible 3, in which the external environment has an over-pressure with respect to the internal environment of above 5 Kpa.

According to a further embodiment of the method, there is provided the further step, at the outlet 6 of the crucible 3, of separating the tar and/or cycloaromatic hydrocarbons 9 from the fumes 7 exiting the crucible.

According to an embodiment, the exhaust gas exiting the crucible is used for burners which raise or maintain the temperature of the oven. By virtue of this provision, it is possible to avoid the total separation of the tar and the cycloaromatic hydrocarbons since they are burned by the burners as in a thermo-destruction plant.

According to a further embodiment, there is provided the further step of feeding methane gas, or butane, or ethane, or propane, or a combination thereof, and/or preferably methane with 96% purity as a gas 4 being suitable for the densification to the crucible 3.

According to a further embodiment of the method, there is provided the further step of bringing the exhaust gas 9 exiting the crucible 3 to room pressure Pe.

According to a further embodiment of the method, there is provided the further step of storing the exhaust gas 9 at room pressure in a storage reservoir 50.

According to a further embodiment of the method, there is provided the further step of using the exhaust gas 9 exiting the crucible 3 and brought to room pressure Pe as a fuel to feed at least one burner 10 to bring and/or keep the desired temperature Ti of the crucible 3.

According to a further embodiment of the method, there is provided the further step, during the initial heating steps of the crucible 3, of using substantially pure methane to feed at least one burner 10 to bring the desired temperature of the crucible 3.

According to a further embodiment of the method, there is provided the further step, at operational temperature, of using the exhaust gas 9 exiting the crucible 3 and brought to room pressure Pe as a fuel to feed at least one burner 10 and keep the desired temperature Ti of the crucible 3.

According to a further embodiment of the method, there is provided the further step of integrating the fuel gas 13 into the exhaust gas 9 exiting the crucible 3.

According to a further embodiment of the method, there is provided the further step of arranging the crucible 3 in an oxide oven 11.

For example, said oxide ovens are ovens with oxide refractories such as alumina and/or mullite in which cycles with oxidizing atmospheres are performed. In these ovens the use of Kanthal® or super Kanthal® electric resistances is provided. For example, an oven of this type is the Nabertherm GmbH p muffle oven with a maximum temperature of 1400° C. and a volume of 400 liters.

According to a further embodiment of the method, there is provided the further step of keeping the inner oven chamber 12 in an oxidizing environment.

According to a further embodiment of the method, there is provided the further step of keeping the inner oven chamber 12 at the pressure that can reach the room pressure Pe.

According to a further embodiment of the method, there is provided the further step of bringing the pressure of the inner oven chamber 12 to the pressure of 30-90 KPa.

According to a further embodiment of the method, there is provided the further step of keeping a room temperature Ta outside said oxide oven 11.

According to a further embodiment of the method, there is provided the further step of providing a crucible 3 of silicon carbide SiC.

According to a further embodiment of the method, there is provided the further step of providing a crucible 3 of silicon-infiltrated silicon carbide (Si—SiC).

According to a further embodiment of the method, there is provided the further step of providing a crucible (3) of silicon-infiltrated (Si—SiC) sintered silicon carbide (SiC).

According to a further embodiment of the method, there is provided the further step of providing a crucible 3 of boron carbide B4C.

According to a further embodiment of the method, there is provided the further step of providing a crucible 3 of silicon-infiltrated boron carbide (Si—B4C).

According to a further embodiment of the method, there is provided the further step of providing a crucible 3 of zircon carbide ZrC.

According to a further embodiment of the method, there is provided the further step of providing a crucible 3 of silicon-infiltrated zirconium carbide (Si—ZrC).

According to a further embodiment of the method, there is provided the further step of providing a crucible 3 in a combination of silicon carbide SiC, boron carbide B4C and zirconium carbide BZrC.

According to a further embodiment of the method, there is provided the further step of providing a crucible 3 of sintered silicon carbide SiC.

According to an embodiment, the crucible is 100% sintered with silicon-infiltrated SiC or SiC, for example obtained from a SiC powder preform infiltrated with Si. This material allows working up to 1400° C., although it is much easier and faster to produce than traditional crucibles.

This crucible has the desired conductivity in addition to the desired resistance to the oxidizing environment.

These crucibles resist oxidation because they passivate upon contact with oxygen, where part of the product is transformed into a micrometric layer of SiO2 or oxide glasses which protects the crucible itself.

According to a further embodiment of the method, there is provided the further step of providing a crucible 3 comprising an open container 14 forming an inner loading chamber 15 of the porous components 1 to be densified.

According to a further embodiment of the method, there is provided the further step of providing an open container 14 comprising container supporting surfaces 16 wherein said container supporting surfaces 16 are grinded and lapped.

According to a further embodiment of the method, there is provided the further step of providing a crucible 3 comprising a crucible lid 17 having lid supporting surfaces 18 for supporting the lid 17 to the open container 14, wherein said lid supporting surfaces 18 are grinded and lapped.

According to a further embodiment of the method, there is provided the further step of directly supporting said lid supporting surfaces 18 to said container supporting surfaces 16 by sealing said crucible; bringing the pressure of the closed inner loading chamber to a pressure between 0.1 KPa and 25 KPa.

According to a further embodiment of the method, there is provided the further step of keeping a pressure differential between the inner chamber 15 of the crucible 3 and the chamber 12 of the oven 11 of at least 5 KPa, so that the inner chamber 15 is depressurized with respect to an outer chamber or oven chamber 11.

According to a further embodiment of the method, there is provided the further step of keeping a pressure differential between the inner chamber 15 of the crucible 3 and the chamber 12 of the oven 11 of at least 10 KPa, so that the inner chamber 15 is depressurized with respect to an outer chamber or oven chamber 11.

According to a further embodiment of the method, there is provided the further step of supporting said lid supporting surfaces 18 to said container supporting surfaces 16 by sealing said crucible by means of the interposition of a sealing gasket 19; bringing the pressure of the closed inner loading chamber to a pressure between 0.1 KPa and 25 KPa.

The present invention also relates to an assembly which allows implementing one of the methods described above.

According to a general embodiment, an assembly 1 for densifying porous components, according to the method known as Chemical Vapor Infiltration, comprises:
- at least one crucible 3 adapted to receive porous components 1 to be densified;
- said crucible 3 is made of a material adapted to resist the densification temperature and pressure and adapted to be internally exposed to a reducing atmosphere;
- said crucible 3 comprises a crucible inlet 5 for introducing a gas 4, which is suitable for densification, into the crucible 3 at a predetermined pressure Pi and a predetermined flow rate Q;
- said crucible 3 comprises a crucible outlet 7 for evacuating the exhaust gas 10;
- said assembly 1 further comprises an oven 12 adapted to internally operate at temperatures which are suitable for the CVI process.

According to an embodiment, said crucible 3 is placed inside said oven 12; and wherein said assembly 1 further comprises a vacuum pump 22 adapted to create a pressure between 0.1 KPa and 25 KPa inside said crucible 3.

According to an embodiment, said crucible 3 is made of a material adapted to be externally exposed to an oxidizing atmosphere; and wherein said crucible 3 is made of a material having a thermal conductivity greater than 30 W/mK from room temperature to 1000° C. This material is selected from at least one of the following:
- sintered silicon carbide (SiC);
- or
- silicon-infiltrated silicon carbide (Si—SiC);
- or sintered boron carbide (B4C);
or
silicon-infiltrated boron carbide (Si—B4C);
or
sintered zirconium carbide (ZrC);
or
silicon-infiltrated zirconium carbide (Si—ZrC);
or
a combination of silicon carbide (SiC), boron carbide (B4C) and sintered and/or silicon-infiltrated zirconium carbide (ZrC).

According to a different general embodiment completely independent of the previous one, an assembly 1 for densifying porous components, according to the method known as Chemical Vapor Infiltration, comprising:
at least one crucible 3 adapted to receive porous components 1 to be densified;
said crucible 3 is made of graphite adapted to withstand the densification temperature and pressure;
said crucible 3 comprises a crucible inlet 5 for introducing a gas 4, which is suitable for densification, into the crucible 3 at a predetermined pressure Pi and a predetermined flow rate Q;
said crucible 3 comprises a crucible outlet 7 for evacuating the exhaust gas 10;
said assembly 1 further comprises an oven 12 adapted to internally operate at temperatures which are suitable for the CVI process.

Advantageously, said crucible 3 is placed inside said oven 12.

According to an embodiment, said assembly 1 further comprises a vacuum pump 22 adapted to create a pressure between 0.1 KPa and 25 KPa inside said crucible.

According to an embodiment, said crucible 3 is made of a material adapted to be externally exposed to an oxidizing atmosphere.

According to an embodiment, said oven 12 defines an inner oven chamber 12 which laps against said crucible 3 and placed at an atmospheric pressure of about 90 KPa.

According to an embodiment, said assembly 1 further comprises a vacuum pump 22 adapted to create a pressure ranging from 0.1 KPa to 25 KPa inside said crucible so that, in operational state, inside said crucible 3 a reducing environment is formed.

According to an embodiment, said crucible 3 is adapted to have externally an atmospheric pressure of about 90 KPa.

According to an embodiment, said open container 15 delimits an inner loading chamber 16 adapted to receive at least one braking band 1 for a disc of a disc brake to be densified, preferably a plurality of braking bands 1 for a disc of a brake disc to be densified.

According to an embodiment, said assembly 1 further comprises an oxide oven 12 adapted to operate internally at room pressure and temperatures suitable for the CVI process.

According to an embodiment, said crucible is made of graphite.

According to an embodiment, said crucible 3 is externally coated with an oxide-resistant coating.

According to an embodiment, said coating comprises Engobbio® or engobe.

According to an embodiment, the outer crucible chamber 12 or inner oven chamber 12 is an oxidizing environment, in which said external environment laps against said crucible 3.

According to an embodiment, said crucible 3 comprises an open container 15 and a lid 17 adapted to seal said open container 15.

According to an embodiment, said open container 15 defines an inner loading chamber 16 adapted to receive at least one porous component 1, preferably a plurality of porous components 1.

According to an embodiment, said open container 14 comprises container supporting surfaces 16 and wherein said container supporting surfaces 16 are grinded and lapped.

According to an embodiment, said crucible lid 17 comprises lid supporting surfaces 18 for supporting the lid 17 to the open container 14, and wherein said lid supporting surfaces 18 are grinded and lapped.

According to an embodiment, said lid supporting surfaces 18, with closed crucible 3, rest on said container supporting surfaces 16, sealing said crucible 3.

According to an embodiment, said lid supporting surfaces 18, with closed crucible, rest on said container supporting surfaces 16 by sealing said crucible by means of the interposition of a sealing gasket 19.

According to an embodiment, said crucible 3 is of a material adapted to have externally an atmospheric pressure of about 90 KPa.

According to an embodiment, said assembly 1 further comprises an oxide oven 12 adapted to operate internally at room pressure and temperatures suitable for the CVI process.

According to an embodiment, said crucible 3 is externally coated with an oxide-resistant coating.

According to an embodiment, said external coating of the crucible 3 comprises Engobbio® or engobe.

According to an embodiment, said coating is made of a material comprising metals, for example refractory steels.

According to an embodiment, the outer crucible chamber 12 or inner oven chamber 12 is an oxidizing environment, in which said chamber 12 or said environment laps against said crucible 3.

According to an embodiment, said crucible comprises silicon carbide SiC.

According to an embodiment, said crucible (3) comprises silicon-infiltrated silicon carbide (Si—SiC);
and/or wherein
said crucible (3) comprises silicon-infiltrated (Si—SiC) sintered silicon carbide (SiC);
and/or wherein
said crucible 3 comprises boron carbide B4C;
and/or wherein
said crucible (3) comprises silicon-infiltrated boron carbide (Si—B4C);
and/or wherein
said crucible 3 comprises zirconium carbide ZrC;
and/or wherein
said crucible (3) comprises silicon-infiltrated zirconium carbide (Si—ZrC);
and/or wherein
said crucible 3 comprises a combination of silicon carbide SiC, boron carbide B4C and zirconium carbide ZrC;
and/or wherein
said crucible 3 comprises sintered silicon carbide SiC.

According to an embodiment, said open container 14 comprises silicon carbide SiC.

According to an embodiment, said crucible lid 17 comprises silicon carbide SiC.

According to an embodiment, said crucible inlet 5 is provided in said open container 14.

According to an embodiment, said crucible outlet 6 is provided in said crucible lid 17.

According to an embodiment, said vacuum pump 21 is a back-flow nitrogen pump adapted to keep said exhaust gases 9 dry. For example, said vacuum pump 21 is a screw pump NC 0100 B, NC 0200 B, NC 0300 B from Ateliers Busch SA, or a cryogenic pump, for example a NIKKISO cryogenic pump from Lewa GmbH.

According to an embodiment, said vacuum pump 21 is adapted to bring said exhaust gases 9 to a room pressure downstream of said vacuum pump 21, or a limited overpressure adapted to convey said exhaust gases 9 to at least one burner 10.

According to an embodiment, a storage reservoir 50 for the exhaust gas 9 is provided downstream of said vacuum pump 21.

According to an embodiment, said reservoir comprises a device for separating tar and/or cycloaromatic hydrocarbons 40; and said assembly 1 comprises a cooling device 51 for the exhaust gases 9.

According to an embodiment, said oxide oven 11 comprises resistance heating components 22, 42.

According to an embodiment, said oven 11 comprises induction heating components.

According to an embodiment, said oxide oven 11 comprises free-flame heating components, for example burners 10 adapted to operate at room pressure.

According to an embodiment, said oxide oven 11 comprises four burners 10.

According to an embodiment, said assembly 1 comprises a recirculation duct 23 fluidically connecting said vacuum pump 21 to said at least one burner 10.

According to an embodiment, said recirculation duct 23 comprises a fuel gas inlet 24 for introducing into said duct a fuel gas 13 to be integrated with exhaust gas for a burner.

According to an embodiment, said oxide oven 11 comprises a combustion fume exhaust duct 38.

According to an embodiment, said assembly 20 comprises at least one gas feeding cylinder or bottle 39 suitable for densification, for example methane CH4, connected to said crucible inlet 5.

According to an embodiment, at least technical service gas feeding cylinder or circuit is provided, such as for example nitrogen and/or argon or the like for washing the inner chamber of the crucible during the heating steps until the desired crucible temperature is reached.

According to an embodiment, said assembly 20 comprises a tar and/or cycloaromatic hydrocarbon separation device 40 connected downstream of said crucible outlet 6.

According to an embodiment, said assembly 20 comprises an exhaust gas discharge duct 41 connected downstream of said vacuum pump 21.

According to an embodiment, said gas suitable for densification 4 is methane gas, or butane, or ethane, or propane or combination of at least two of these.

According to an embodiment, said assembly 1 comprises a carousel device 25 comprising a closed-path, continuous movement device 26 supporting at least two crucibles 3.

According to an embodiment, a closed-path continuous movement device 26 comprises a loading section 27 suitable for loading at least one porous component 1 into said crucible 3 when open.

According to an embodiment, a closed-path continuous movement device 26 comprises a discharging section 28 suitable for discharging at least one densified component 2 from said crucible 3, when open.

According to an embodiment, a closed-path continuous movement device 26 comprises a treatment section 29 associated with a continuous oven 30 of the continuous oxide oven type, for example a tunnel oven from Riedhammer.

According to an embodiment, said continuous oven 30 allows the introduction of the at least two crucibles 3 and the exiting thereof.

According to an embodiment, said carousel device 25 comprises a movable feeding device 31 removably connected to at least one of the at least two crucibles 3 for feeding said densifying gas 4; and said carousel device 25 comprises a movable evacuation device 32 for evacuating the exhaust gas 9 from at least one crucible 3 and putting under vacuum the crucible 3 thus bringing the crucible pressure between 1 KPa and 15 KPa.

According to an embodiment, said crucible inlet 5 comprises a fast-coupling crucible inlet valve 33 for selectively connecting and disconnecting said movable feeding device 31 for feeding the densifying gas 4; and said crucible outlet 6 comprises a fast-coupling crucible outlet valve 34 for selectively connecting and disconnecting said movable evacuation device 32 for evacuating said exhaust gas 9 and generating vacuum in the crucible 3.

According to an embodiment, said closed-path, continuous movement device 26 comprises a porous component loading station 35 for loading at least one porous component 1 into said crucible 3.

According to an embodiment, said closed-path, continuous movement device 26 comprises a densified component discharging station 36 for discharging at least one densified component 2 from said crucible 3.

According to a further embodiment, a plant, for example a plant useful for experimentation, comprises a crucible or reactor chamber of silicon carbide or SiC. The material used is silicon-infiltrated silicon carbide. The chamber consists of two parts, the main container and the lid. The structure is cylindrical with dimensions of the useful part for loading the preforms of 400 mm of diameter and 335 mm of height. The thickness of the walls is 8 mm. The two parts are in contact by means of a lapped flange on a surface of 700 cm2 which allows obtaining the vacuum seal. The chamber was built based on our project.

The commercial type oven (for example for oxides) consists of a simple pit oven which can work at a maximum temperature of 1320° C., has Kanthal® resistors and an electrical power of 13.2 kW. The insulation is in alumina-based refractory oxide.

The cooling line is in stainless steel with an internal diameter of 100 mm, coated and water cooled. It consists of 3 inclined sections for an overall length of about 10 meters. Along the line are two wells for collecting condensed hydrocarbons.

The pumping group consists of a double screw dry pump with a maximum flow rate of 150 m3/h and a maximum vacuum level of 0.5 mbar.

The specific construction of the plant used for the experimentation had the main purpose of demonstrating the validity of the innovative concepts introduced and, secondly, of having available the information necessary to design a more efficient and functional plant.

Summary of experimental tests. The first part of the experimentation concerned the verification of the plant design specifications, in particular:
maximum operating temperature,
heating gradients and thermal dissipation,
minimum vacuum level and leakage,
control of process gas flows,
cooling water flows of the vacuum line.

Above all, this step allowed optimizing the vacuum sealing systems.

Subsequently the densification tests were started in order to identify the process parameters that would allow maximizing the carbon deposition efficiency. The relevant parameters are the temperature in the stationing step of the process, the methane flow, the partial pressure level, the duration of the process, the geometry of the load. The ranges of the aforementioned variables that have been explored are the following:

maximum stationing temperature: 1040-1140° C.;
methane flow: 15-60 nl/min;
partial pressure: 75-220 mbar The composition of methane that has been kept constant (Siad 98%)

Initially, carbonized felt was used as a starting material. The felt, in the form of a 300 mm high roll, was wound to form a cylinder with a diameter such as to occupy the entire useful space of the reaction chamber. The gas flow therefore occurred entirely through the mass of the material to be densified. Following 5 test cycles, having identified the best process conditions, a maximum weight gain of 17.5% was achieved in one hour and 34.5% in two hours. The deposit appeared morphologically inhomogeneous and the fibers did not appear homogeneously coated with CVI carbon.

Later, maintaining the same geometry, it was switched to the use of graphitized felt, with which an important increase in deposition efficiency was generally obtained. By adjusting the process parameters a weight increase of 24.6% was achieved in an hour and 92.6% in 4 hours. With this type of preform, the CVI carbon was homogeneous in thickness from the first deposit layers.

Therefore for the tests done it seems that it is possible to densify without particular further precautions and with the same efficiency of the traditional CVI ovens:

preforms of different geometry;
different load configurations;
preforms with different densities.

REFERENCE LIST 1 porous component
2 densified component
3 crucible
4 gas suitable for densification
5 crucible inlet
6 crucible outlet
7 fumes exiting the crucible
8 tar and/or cycloaromatic hydrocarbons
9 exhaust gas exiting the crucible
10 at least one burner
11 oxide oven
12 inner oven chamber
13 fuel gas to be integrated with exhaust gas for burner
14 open container
15 inner loading chamber
16 container supporting surfaces
17 crucible lid
18 lid supporting surfaces
19 crucible sealing gasket
20 assembly
21 vacuum pump
22 resistance heating components
23 recirculation duct
24 fuel gas inlet
25 carousel device
26 closed-path continuous movement device
27 loading section
28 unloading section
29 treatment section
30 continuous oven—Riedhammer SACMI oven for sanitary ware trolley tunnel oven for sanitary ware are mentioned
31 movable feeding device
32 movable evacuation device
33 fast-coupling crucible inlet valve
34 fast-coupling crucible outlet valve
35 porous component loading station
36 densified component unloading station
37 flowmeter
38 combustion fume exhaust duct
39 gas feeding bottle or circuit suitable for densification, for example CH4
40 tar and/or cycloaromatic hydrocarbon separation device
41 exhaust gas discharge duct
42 resistance heating elements, for example in Kanthal or super-Kanthal
50 exhaust gas storage reservoir
51 exhaust gas cooling device
52 vacuum pump for environment outside the crucible and inside the oven
Pi pressure inside the crucible
Ti temperature inside the crucible
Ta room temperature
Pe pressure outside the crucible
Q predetermined flow rate of densifying gas

The invention claimed is:

1. A chemical vapor infiltration (CVI) method for densifying at least one porous component, the CVI method comprising:
    placing the at least one porous component inside a crucible;
    bringing temperature and pressure inside the crucible to a value adapted to densify the at least one porous component to transform it into a densified or partially densified component;
    once operational temperature and pressure are reached, flowing gas adapted to densify the at least one porous component to transform it into a densified component inside the crucible;
    wherein the CIV method further comprises:
    keeping an oxidizing environment outside the crucible, wherein external environment laps against said crucible;
    and wherein
    said crucible comprises a core made of at least one of the following materials having thermal conductivity greater than 30 W/mK from room temperature to at least 1000° C.: sintered silicon carbide (SiC), silicon-infiltrated silicon carbide (Si—SiC), sintered boron carbide (B4C), silicon-infiltrated boron carbide (Si—B4C), sintered zirconium carbide (ZrC), silicon-infiltrated zirconium carbide (Si—ZrC), a combination of silicon carbide (SiC), boron carbide (B4C) and sintered and/or silicon-infiltrated zirconium carbide (ZrC).

2. The CVI method of claim 1, further comprising:
    at operational temperature, pressure and fluxing of the gas, obtaining a non-oxidizing or reducing environment inside the crucible.

3. The CVI method of claim 1, further comprising:
    keeping temperature and pressure inside the crucible to a value adapted to densify the at least one porous component to transform it into a densified or partially densified component;

or bringing temperature inside the crucible between 900° C. and 1300° C.;

or bringing pressure inside the crucible between 0.1 KPa and 25 KPa;

or adjusting flow of gas at an inlet of the crucible at a value between 0.1 l/min/dm3 and 10 l/min/dm3, where dm3 is meant as the volume of the crucible chamber.

4. The CVI method of claim 1, further comprising:
once temperature suitable for densification is reached, obtaining a non-oxidizing or reducing environment inside the crucible, wherein, throughout process, the oxidizing environment is kept outside the crucible, in which said external environment laps against said crucible.

5. The CVI method of claim 1, further comprising:
keeping pressure outside the crucible equal to room pressure, that is about 90 KPa, and in any case in over-pressure with respect to the pressure inside of the crucible.

6. The CVI method of claim 1, further comprising:
providing said crucible of a material having thermal conductivity between 120 and 80 W/mK at 400° C.

7. The CVI method of claim 1, further comprising:
providing a component with a matrix comprising fibers as a porous component;

or providing a component with a matrix comprising carbon fibers as a porous component;

or providing a component with a matrix comprising silicon carbide (SiC) fibers as a porous component.

8. The CVI method of claim 1, further comprising:
coating said crucible with oxidation resistant coating;

or providing said coating of a material comprising metals, including refractory steels.

9. The CVI method of claim 1, further comprising:
during start-up of the process, washing the crucible with nitrogen (N2).

10. The CVI method of claim 1, further comprising:
bringing pressure inside the crucible between 1 KPa and 20 KPa;

or keeping pressure outside the crucible equal to room pressure.

11. The CVI method of claim 1, further comprising:
adjusting gas flow at the inlet to the crucible between 10 l/min and 60 l/min.

12. The CVI method of claim 1, further comprising:
separating, at an outlet of the crucible, tar and/or cycloaromatic hydrocarbons from fumes exiting the crucible.

13. The CVI method of claim 1, further comprising:
feeding at least one of methane, butane, ethane, propane, or a combination thereof, and/or methane with 96% purity as a gas suitable for densification to the crucible.

14. The method of claim 1, further comprising:
storing exhaust gas at room pressure in a storage reservoir, and using the exhaust gas exiting the crucible and brought to room pressure as a fuel to feed at least one burner to bring and/or keep a desired temperature inside of the crucible;

or during initial steps of heating the crucible, using methane to feed at least one burner to obtain the desired temperature inside the crucible; then, when fully operational, using the exhaust gas exiting the crucible and brought to room pressure as a fuel to feed at least one burner and keep the desired temperature inside the crucible.

15. The CVI method of claim 1, further comprising:
integrating fuel gas and combustion air in the exhaust gas exiting the crucible.

16. The CVI method of claim 1, further comprising:
arranging the crucible in an oxide oven;

or keeping an inner oven chamber in an oxidizing environment;

or keeping the inner oven chamber at a pressure capable of reaching room pressure;

or bringing pressure of the inner oven chamber to a pressure between 15 KPa and 90 KPa;

or keeping room temperature outside said oxide oven.

17. The CVI method of claim 1, further comprising:
providing a crucible comprising an open container forming an inner loading chamber of the at least one porous component to be densified;

providing said open container comprising container supporting surfaces, wherein said container supporting surfaces are grinded and lapped;

providing a crucible comprising a crucible lid having lid supporting surfaces for supporting the crucible lid to the open container, wherein said lid supporting surfaces are grinded and lapped;

or directly supporting said lid supporting surfaces to said container supporting surfaces by sealing said crucible;

bringing pressure of the closed inner loading chamber to a pressure between 0.1 KPa and 25 KPa;

or keeping a pressure differential between the inner loading chamber of the crucible and the inner oven chamber of the oxide oven of at least 5 KPa, so that the inner loading chamber is depressurized with respect to an outer chamber or oven chamber;

or supporting said lid supporting surfaces to said container supporting surfaces by sealing said crucible by interposition of a sealing gasket;

or bringing pressure of the closed inner loading chamber to a pressure between 0.1 KPa and 25 KPa.

18. The CVI method of claim 1, wherein said core is uncoated.

19. A chemical vapor infiltration (CVI) method for densifying at least one porous component, the CVI method comprising:

placing the at least one porous component inside a crucible;

bringing temperature and pressure inside the crucible to a value adapted to densify the at least one porous component to transform it into a densified or partially densified component;

once operational temperature and pressure are reached, flowing gas adapted to densify the at least one porous component to transform it into a densified component inside the crucible;

wherein the CIV method further comprises:
keeping an oxidizing environment outside the crucible, wherein external environment laps against said crucible;
and wherein
said crucible consists of one or more of the following materials having thermal conductivity greater than 30 W/mK from room temperature to at least 1000° C.: sintered silicon carbide (SiC), silicon-infiltrated silicon carbide (Si—SiC), sintered boron carbide (B4C), silicon-infiltrated boron carbide (Si—B4C), sintered zirconium carbide (ZrC), silicon-infiltrated zirconium carbide (Si—ZrC), a combination of silicon carbide (SiC), boron carbide (B4C) and sintered and/or silicon-infiltrated zirconium carbide (ZrC).

* * * * *